US011955985B2

United States Patent
Minotani et al.

(10) Patent No.: US 11,955,985 B2
(45) Date of Patent: Apr. 9, 2024

(54) AD CONVERTER

(71) Applicant: Nippon Telegraph and Telephone Corporation, Tokyo (JP)

(72) Inventors: Tadashi Minotani, Musashino (JP); Kenichi Matsunaga, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 130 days.

(21) Appl. No.: 17/782,766

(22) PCT Filed: Dec. 10, 2019

(86) PCT No.: PCT/JP2019/048287
§ 371 (c)(1),
(2) Date: Jun. 6, 2022

(87) PCT Pub. No.: WO2021/117133
PCT Pub. Date: Jun. 17, 2021

(65) Prior Publication Data
US 2023/0006686 A1 Jan. 5, 2023

(51) Int. Cl.
*H03M 1/00* (2006.01)
*H03M 1/34* (2006.01)

(52) U.S. Cl.
CPC .................... *H03M 1/34* (2013.01)

(58) Field of Classification Search
CPC ............. H03M 1/34; H03M 1/52; H03M 1/14
USPC ................................................ 341/155, 126
See application file for complete search history.

(56) References Cited

U.S. PATENT DOCUMENTS 6,980,139 B2 * 12/2005 Doerrer .................. H03M 3/37
341/118

OTHER PUBLICATIONS

MEMEs Support Page, *Overview and Mechanism of A / D Conversion*, MEMEs Support Page-Play with MEMEs!, Sep. 10, 2018 (reading day), Day), http://memes.sakura.ne.jp/memes/?page_id=1120, pp. 1-6.

(Continued)

*Primary Examiner* — Jean B Jeanglaude
(74) *Attorney, Agent, or Firm* — Workman Nydegger

(57) ABSTRACT

An AD converter includes: an integration unit that uses an input voltage as an initial value and repeats an operation of integrating one or both of two types of unit voltages with the input voltage, thereby generating an integrated voltage; a switching threshold voltage unit that includes two types of threshold voltages causing the operation of integrating to be terminated; a comparator that compares the integrated voltage with the threshold voltages; an integration determination unit that, before the operation of integrating is started, causes the comparator to compare the input voltage with a rough adjustment threshold voltage corresponding to a larger one of the unit voltages; a unit voltage switching control unit that, when the rough adjustment threshold voltage is larger than the input voltage, controls the integration unit to generate the integrated voltage by using the two types of unit voltages; and a single unit voltage control unit that, when the rough adjustment threshold voltage is smaller than the input voltage, controls the integration unit to generate the integrated voltage by using only a smaller one of the unit voltages.

4 Claims, 6 Drawing Sheets

(56) References Cited

OTHER PUBLICATIONS

Steve Bowling, *Meaning of A / D Converter Performance Specification Values*, Microchip Technology, Inc., 2017, http://ww1.microchip.com/downloads/jp/AppNotes/00693A_JP.pdf, pp. 1-10.
Latest Analog Basic Glossary—DNL and INL—, Texas Instruments Japan Limited, Apr. 30, 2014, http://www.til.co.jp/lsds/ti_ja/analog/glossary/dnl_inl.page, pp. 1.

* cited by examiner (a) WHEN SW2 IS CONNECTED (b) WHEN SW2 IS DISCONNECTED

AD CONVERTER

TECHNICAL FIELD

The present invention relates to an AD converter.

BACKGROUND ART

An AD converter includes a DA converter unit that outputs a known voltage, a sample holding unit that holds a voltage value of an analog input, and a comparator. It sequentially changes an output value of the DA converter unit and uses, as a converted value in the AD converter, a digital value when the minimum output value of the DA converter unit at which an output of the comparator changes from a low output voltage to a high output voltage is set (Non Patent Literature 1).

For the AD converter, it is important to reduce nonlinearity so as to reduce an error between an input voltage value and a converted value (code), and the nonlinearity includes differential nonlinearity and integral nonlinearity (Non Patent Literature 2). If the differential nonlinearity is larger than a minimum unit voltage (LSB) defined in the AD converter, a phenomenon called a missing code occurs in which a converted value (code) corresponding to an input voltage value is not output (Non Patent Literature 3). In a case where this missing code has occurred, output of the same code for different input voltage values also occurs, thereby a relationship between the input voltage value and the converted value (code) becomes nonmonotonic.

CITATION LIST

Non-Patent Literature

Non-Patent Literature 1: Overview and Mechanism of A/D conversion in MEMEs support page[searched on Sep. 10, 2018], Internet (URL: http://memes.sakura.ne.jp/memes/?page_id=1120)

Non-Patent Literature 2: Understanding A/D Converter Performance Specifications [searched on Sep. 9, 2019], Internet (URL: http://ww1.microchip.com/downloads/jp/AppNotes/00693A_JP.pdf)

Non-Patent Literature 3: Latest Glossary of Analog Device Basic Terminologies—DNL and INL—[searched on Sep. 9, 2019], Internet (URL: http://www.tij.co.jp/lsds/ti_ja/analog/glossary/dnl_inl.page)

SUMMARY OF THE INVENTION

Technical Problem

When a missing code occurs and a relationship between an input voltage value and a converted value (code) in the AD converter is nonmonotonic, not only an error between an input voltage value calculated from the converted value and an actual input voltage value is large, but also the accuracy of signal analysis in later stages of the AD converter deteriorates because there is an input voltage value that is actually input but does not exist in a converted value.

The present invention has been made in view of this problem, and it is an object of the present invention to provide an AD converter that does not cause a missing code and prevents the accuracy of signal analysis in later stages of the AD converter from deteriorating.

Means for Solving the Problem

An AD converter according to one aspect of the present invention includes: an integration unit that uses an input voltage as an initial value and repeats an operation of integrating one or both of two types of unit voltages with the input voltage, thereby generating an integrated voltage; a switching threshold voltage unit that includes two types of threshold voltages causing the operation of integrating to be terminated; a comparator that compares the integrated voltage with the threshold voltages; an integration determination unit that, before the operation of integrating is started, causes the comparator to compare the input voltage with a rough adjustment threshold voltage corresponding to a larger one of the unit voltages; a unit voltage switching control unit that, when the rough adjustment threshold voltage is larger than the input voltage, controls the integration unit to generate the integrated voltage by using the two types of unit voltages; and a single unit voltage control unit that, when the rough adjustment threshold voltage is smaller than the input voltage, controls the integration unit to generate the integrated voltage by using only a smaller one of the unit voltages.

Further, an AD converter according to another aspect of the present invention includes: a unit voltage check integration unit that uses an input voltage as an initial value and repeats an operation of integrating one or both of two types of unit voltages with the input voltage, thereby generating an integrated voltage and also generates a check voltage larger than a larger one of the unit voltages; a threshold voltage unit that includes a threshold voltage causing the operation of integrating to be terminated; a comparator that compares the integrated voltage with the threshold voltage; an integration determination unit that, before the operation of integrating is started, causes the comparator to compare a sum voltage with the threshold voltage, the sum voltage being a sum of the input voltage and the check voltage; a unit voltage switching control unit that, when the threshold voltage is larger than the check voltage, controls the unit voltage check integration unit to generate the integrated voltage by using the two types of unit voltages; and a single unit voltage control unit that, when the threshold voltage is smaller than the check voltage, controls the unit voltage check integration unit to generate the integrated voltage by using only a smaller one of the unit voltages.

Effects of the Invention

According to the present invention, an AD converter that does not cause a missing code and prevents the accuracy of signal analysis in later stages of the AD converter from deteriorating can be provided.

DESCRIPTION OF EMBODIMENTS

Figure 1:
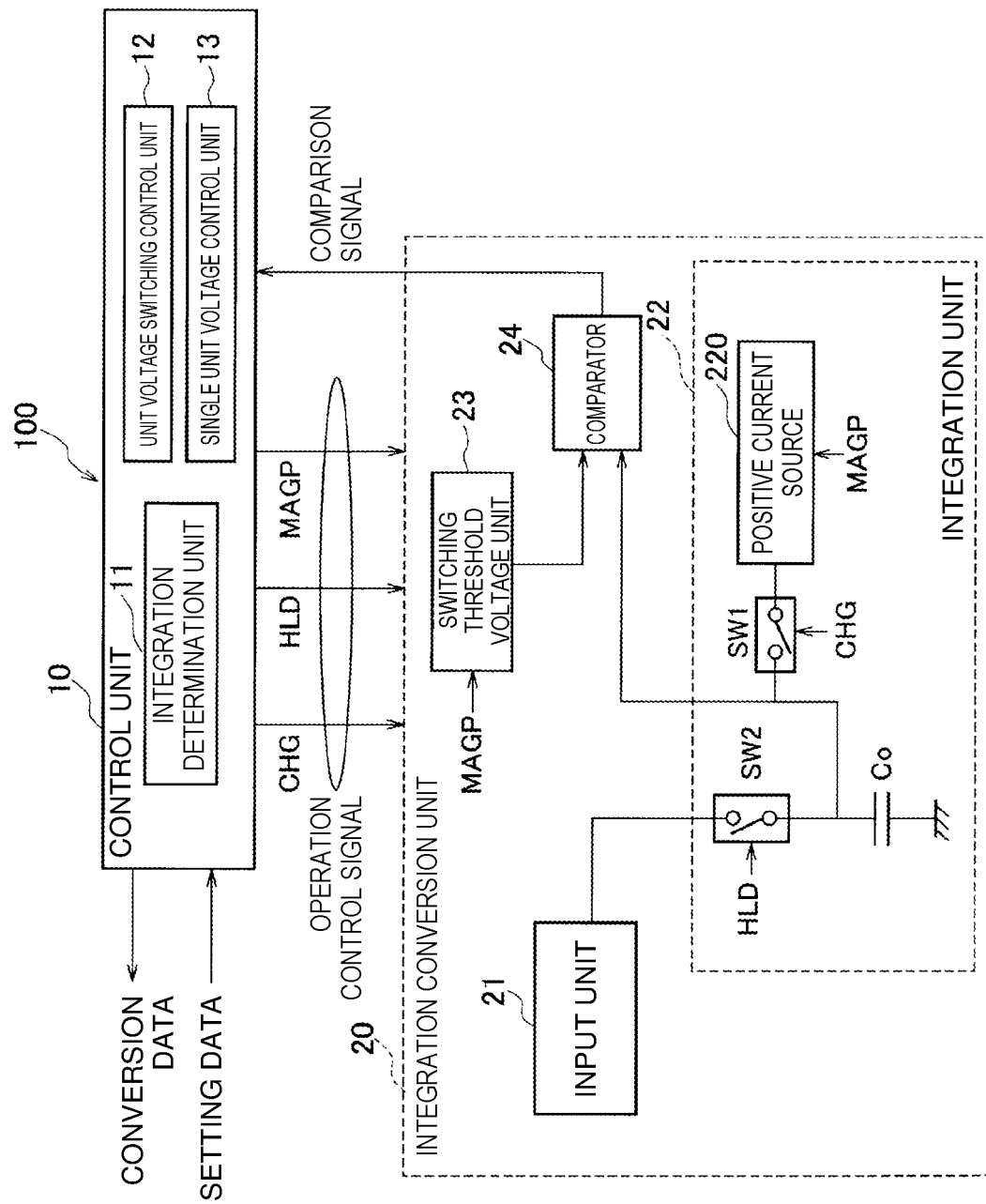
FIG. 1 is a functional block diagram illustrating a configuration example of an AD converter according to a first embodiment of the present invention.

Hereinafter, embodiments of the present invention will be described with reference to drawings. The same components in a plurality of drawings are denoted by the same reference numerals and the description will not be repeated.

First Embodiment

FIG. 1 is a functional block diagram of an AD converter according to a first embodiment of the present invention. The AD converter 100 illustrated in FIG. 1 includes a control unit 10 and an integration conversion unit 20. The control unit 10 includes an integration determination unit 11, a unit voltage switching control unit 12, and a single unit voltage control unit 13. The integration conversion unit 20 includes an input unit 21, an integration unit 22, a switching threshold voltage unit 23, and a comparator 24. The integration unit 22 includes a first switch SW1, a second switch SW2, a capacitance Co, and a positive current source 220.

The AD converter converts an input voltage Vin into a digital value by comparing an integrated voltage Vo, which is generated by integrating a unit voltage with the input voltage as an initial value in the integration unit 22, with a threshold voltage Vt by the comparator 24. As for a unit voltage that is a unit of the amount of change in the integrated voltage, there are two types of unit voltages in the AD converter a rough adjustment unit voltage VG2 that is a relatively large unit voltage, and a fine adjustment unit voltage VG1 that is a minimum unit voltage. There is provided a function of checking which of a difference between the threshold voltage Vt and the input voltage Vin and the rough adjustment unit voltage is larger, performing, when the rough adjustment unit voltage is larger than the difference, integration up to the threshold voltage only with the fine adjustment unit voltage, and performing, when the rough adjustment unit voltage is smaller than the difference, integration up to the threshold voltage by using the rough adjustment unit voltage and the fine adjustment unit voltage.

In addition, in this embodiment, a switching threshold voltage unit 23 is provided which has two types of thresholds of a rough adjustment threshold voltage used in integration with the rough adjustment unit voltage, and a fine adjustment threshold voltage used in integration with the fine adjustment unit voltage.

Figure 2:
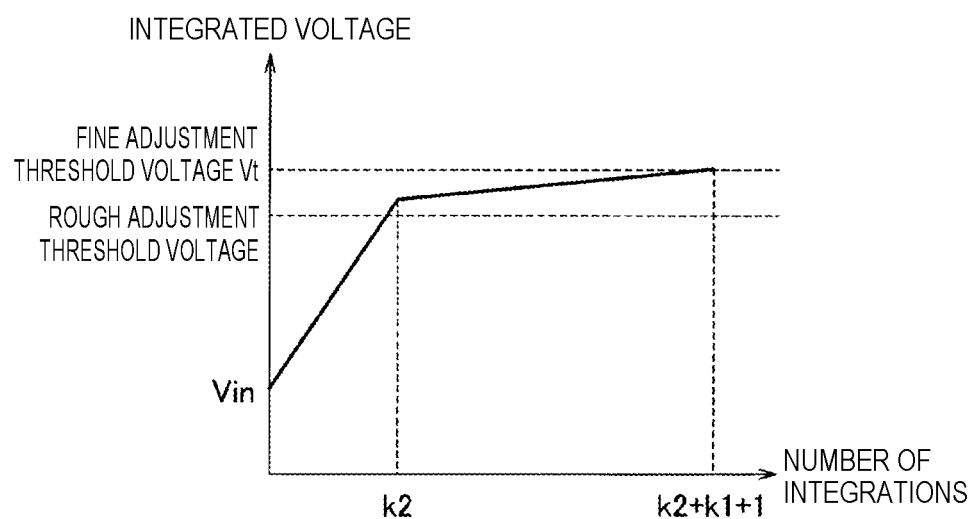
FIG. 2 is a diagram schematically illustrating changes in an integrated voltage at the time of an integration operation.

FIG. 2 illustrates an example of integration at the time of conversion. After the integrated voltage in the integration unit 22 is initialized with the input voltage Vin, the number of integrations k2 at which the integrated voltage obtained by integration using the rough adjustment unit voltage VG2 exceeds the rough adjustment threshold voltage for the first time is first measured, and next, the number of integrations k1+1 at which, in using the fine adjustment unit voltage VG1, it exceeds the fine adjustment threshold voltage Vt for the first time is measured. Whether the integrated voltage exceeds the rough adjustment threshold voltage or the fine adjustment threshold voltage is detected by the comparator 24. When the integrated voltage and the fine adjustment threshold voltage Vt become equal, the following expression holds.

Math. 1

$$Vt = k2 VG2 + (k1 + \delta k1) VG1 + Vin \quad (1)$$

In the expression (1), $\delta k1$ is a real number of 0 or greater and smaller than 1 and $\delta k1$ VG1 represents a difference between Vt and an integrated voltage in the k1-th integration. The Vt, VG2, and VG1 become known parameters after circuit design and manufacture and due to calibration during operation, and therefore the Vin can be determined by an error of VG1 from the expression (1) and measured k2 and k1.

When the accuracy of voltage is improved in the AD converter that uses the integration unit 22, the unit voltage needs to be reduced and accordingly, the time for integration up to the threshold voltage becomes longer, that is, a conversion time becomes longer. In order to prevent prolongation of conversion time while improving the accuracy of voltage, a method of performing integration with a relatively large rough adjustment unit voltage and then performing integration with a fine adjustment unit voltage corresponding to a desired voltage resolution is promising.

In the above method, integration is performed with a rough adjustment unit voltage first and therefore, when an input voltage is larger than a rough adjustment threshold voltage, it may exceed a fine adjustment threshold voltage Vt by one integration with the rough adjustment unit voltage. In this case, a conversion operation ends at k1=0 without performing integration with a fine adjustment integrated voltage. The accuracy at this time is VG2 and an error becomes larger in comparison with a case of the expression (1). In addition, when the input voltage Vin satisfies the following expression, although the minimum unit voltage in the AD converter 100 is the fine adjustment integration unit VG1, every Vin after conversion becomes a single value of Vt-VG2 and the same phenomenon as a missing code occurs.

Math. 2

$$Vin < Vt < Vin + VG2 \quad (7)$$

To prevent this phenomenon, in this embodiment, the input voltage Vin is compared with the rough adjustment threshold voltage before integration, if the rough adjustment threshold voltage is larger than the input voltage Vin, integration is performed in a unit voltage switching mode in which integration is performed using the rough adjustment unit voltage and the fine adjustment unit voltage, and if the rough adjustment threshold voltage is smaller than the input voltage Vin, integration is performed in a single unit voltage mode in which integration is performed with only the fine adjustment unit voltage.

The AD converter 100 of this embodiment includes the integration conversion unit 20 that has two types of integration units which are units of the amount of change in an integrated voltage, two types of threshold voltages which determine an end point of integration, and the comparator 24 which compares the integrated voltage with the threshold voltages, and that integrates the integrated voltage until reaching the threshold voltage, and the control unit 10 that has the integration determination unit 11 which performs processing of comparing an initial value of the integrated voltage with the threshold voltage before the integration is started, the unit voltage switching control unit 12 which, when the initial value of the integrated voltage is smaller than the threshold voltage, causes execution as processing of the integration conversion unit 20, and the single unit voltage control unit 13 which, when the initial value of the integrated voltage is larger than the threshold voltage, causes execution as processing of the integration conversion unit 20.

The integration conversion unit 20 in this embodiment has the integration unit 22 that generates an integrated voltage, the input unit 21 that provides an initial value to the integration unit 22, the switching threshold voltage unit 23 that provides a rough adjustment threshold voltage and a fine adjustment threshold voltage which cause an end point of integration in integration with a rough adjustment unit voltage and integration with a fine adjustment unit voltage, and the comparator 24 that outputs a result of comparing the integrated voltage with the rough adjustment threshold voltage or the fine adjustment threshold voltage.

The integration unit 22 has a positive current source 220 that has two types of current values corresponding to the rough adjustment unit voltage and the fine adjustment unit voltage and outputs a charge which causes an integrated voltage to be generated, a capacitance Co that accumulates the charge to generate the integrated voltage, a first switch SW1 that is connected in accumulating the charge from the positive current source 220 into the capacitance Co, and a second switch SW2 that is connected when an initial value is accumulated in the capacitance.

Switching between the first and second switches SW1 and SW2, between the current values of the positive current source 220, and between the thresholds of the switching threshold voltage unit 23 is controlled using operation control signals of CHG, HLD, and MAGP from the control unit 10.

The integration conversion unit 20 first sets, in converting an input voltage Vin into a digital value, a state in which the rough adjustment threshold voltage is being output from the switching threshold voltage unit 23, and outputs, by the input unit 21, the input voltage Vin as an initial value to the integration unit 22, and causes the second switch SW2 to be connected in the integration unit 22, thereby initializing the capacitance Co with the input voltage Vin. Next, the integration determination unit 11 of the control unit 10 determines a mode based on a result of comparison between the initial value of the integration unit 22 and the rough adjustment threshold voltage by the comparator 24.

When the rough adjustment threshold voltage is larger than the initial value, by means of the unit voltage switching control unit 12, the positive current source 220 is first set to correspond to the rough adjustment unit voltage and in this state, integration is performed until it can be checked by a change of a comparison signal which is output from the comparator 24 that the integrated voltage Vo has exceeded the rough adjustment threshold voltage, and the number of integrations k2 is measured. After that, the threshold voltage is set to the fine adjustment threshold voltage and the positive current source 220 is set to correspond to the fine adjustment unit voltage and in this state, integration is performed until it can be checked by a change of the comparison signal that the integrated voltage Vo has exceeded the fine adjustment threshold voltage, and the number of integrations k1 is measured. Based on the obtained k2 and k1, a converted value of the Vin is obtained.

When the rough adjustment threshold voltage is smaller than the initial value, the threshold voltage is set to the fine adjustment threshold voltage and the positive current source 220 is set to correspond to the fine adjustment unit voltage and in this state, integration is performed until it can be checked by a change of the comparison signal that the integrated voltage Vo has exceeded the fine adjustment threshold voltage, and the number of integrations k1 is measured. Based on the obtained k1, a converted value of the Vin is obtained.

As described above, the AD converter 100 of this embodiment includes the integration unit 22 that uses an input voltage Vin as an initial value and repeats the operation of integrating one or both of two types of unit voltages with the input voltage Vin, thereby generating an integrated voltage, the switching threshold voltage unit 23 that includes two types of threshold voltages which cause the operation of integrating to be terminated, the comparator 24 that compares the integrated voltage with the threshold voltages, the integration determination unit 11 that, before the operation of integrating is started, causes the comparator 24 to compare the input voltage Vin with a rough adjustment threshold voltage corresponding to a larger one of the unit voltages, the unit voltage switching control unit 12 that, when the rough adjustment threshold voltage is larger than the input voltage Vin, controls the integration unit 22 to generate the integrated voltage by using the two types of unit voltages, and the single unit voltage control unit 13 that, when the rough adjustment threshold voltage is smaller than the input voltage Vin, controls the integration unit 22 to generate the integrated voltage by using only a smaller one of the unit voltages. According to this, an integrating type AD converter that, even if an input voltage is close to a threshold, does not cause a missing code and prevents the accuracy of signal analysis in later stages of the AD converter from deteriorating can be provided.

Modification 1

Figure 3:
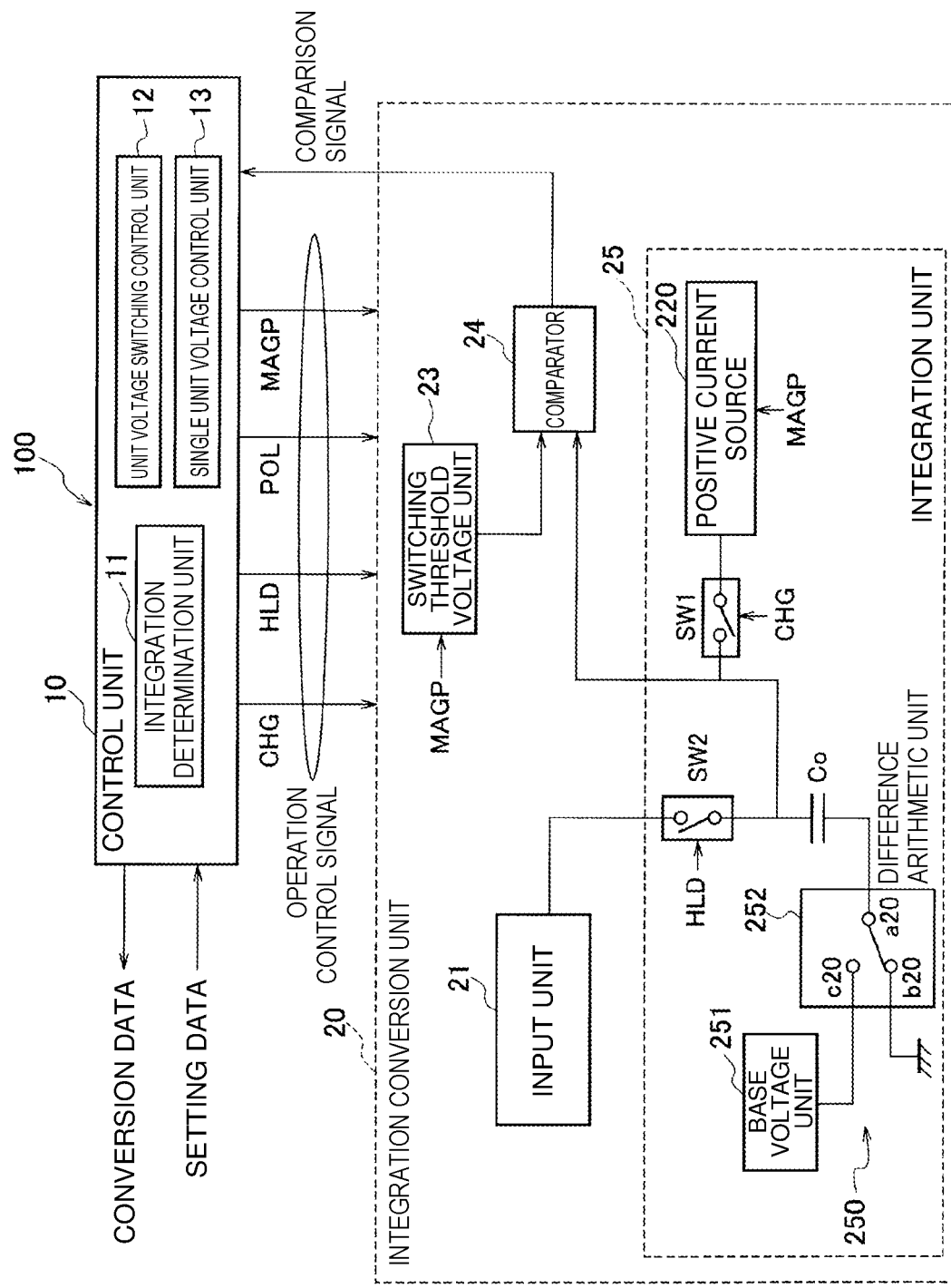
FIG. 3 is a functional block diagram illustrating a configuration example of a modification of the AD converter illustrated in FIG. 1.

FIG. 3 illustrates a modification of the integration unit 22 of the first embodiment. An integration unit 25 of Modification 1 illustrated in FIG. 3 is different from the integration unit 22 in FIG. 1 in that a difference arithmetic unit 250 is provided between the capacitance Co and a ground. The difference arithmetic unit 250 includes a base voltage unit 251 and a switching switch 252.

In a configuration in FIG. 1, conversion is impossible when the input voltage Vin is equal to or higher than the fine adjustment threshold voltage. However, in a configuration in FIG. 3, when the input voltage Vin is equal to or higher than the fine adjustment threshold voltage, the range of input voltage Vin can be extended by performing processing of holding a difference between the input voltage Vin and a base voltage which is generated by the base voltage unit 251, in the capacitance Co by using the difference arithmetic unit 250.

Figure 4:
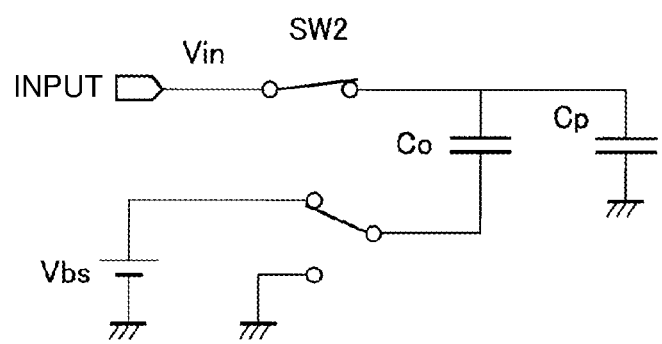
FIG. 4 is a diagram illustrating an equivalent circuit model of an integration unit illustrated in FIG. 3.
Figure 4:
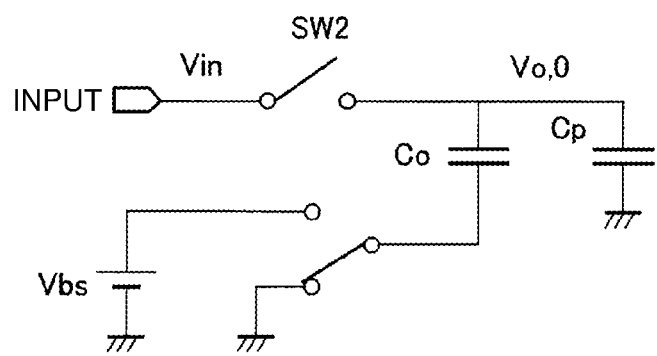

FIG. 4 illustrates an equivalent circuit when a difference between the input voltage Vin and a base voltage Vbs is taken in a conversion state. The Cp represents a parasitic capacitance for wiring, the switching switch 252, and input of the comparator 24. In a case where the input voltage Vin is larger than a reference voltage, a20 and c20 of the switching switch 252 in the difference arithmetic unit 250 are connected when the second switch SW2 is connected in a conversion state. At this time, the equivalent circuit becomes as in FIG. 4(a). Next, after the second switch SW2 is disconnected, a20 and b20 of the switching switch 252 in the difference arithmetic unit 250 are connected (FIG. 4 (b)). In FIGS. 4 (a) and (b), charges accumulated in the Co and Cp are stored and therefore, the following expression (3) is established and an initial voltage value Vo,0 before integration is started is expressed by an expression (4).

Math. 3

$$Cp\ Vin + Co(Vin - Vbs) = Cp\ Vo, 0 + Co\ Vo, 0 \qquad (3)$$

$$Vo, 0 = Vin - \frac{Co}{Co + Cp} Vbs \qquad (4)$$

As described above, the integration unit 25 in Modification 1 includes the base voltage unit 251 that generates a base voltage Vbs lower than an input voltage, and the switching switch 252 that switches, between a ground voltage and the base voltage Vbs, a target to which a terminal of the capacitance Co on a side to be connected to a ground potential is connected, the capacitance Co holding the integrated voltage. As a result, by appropriately setting the base voltage Vbs, Vo,0 can be made within a voltage range of an output terminal of the positive current source 220 even if the input voltage Vin is outside the voltage range of the output terminal of the positive current source 220. Since the subsequent processing is the same as that of the AD converter in FIG. 1, description thereof will be omitted.

According to this configuration, an AD converter that, even if an input range is larger than a threshold or is close to the threshold, does not cause a missing code and prevents the accuracy of signal analysis in later stages of the AD converter from deteriorating can be provided.

Second Embodiment

Figure 5:
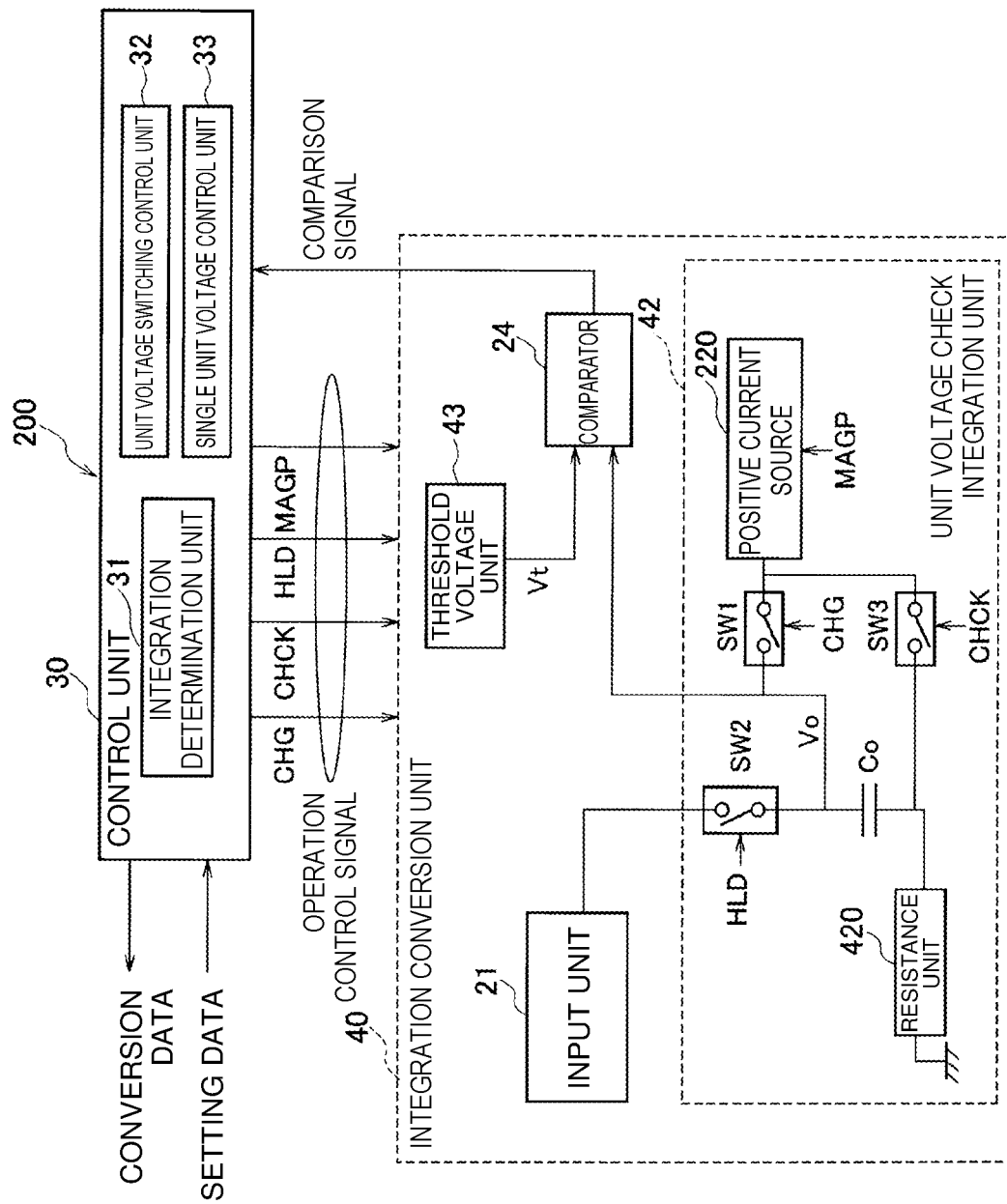
FIG. 5 is a functional block diagram illustrating a configuration example of an AD converter according to a second embodiment of the present invention.

FIG. 5 illustrates a block diagram of an AD converter according to a second embodiment of the present invention. The AD converter 200 illustrated in FIG. 5 includes a control unit 30 and an integration conversion unit 40. The control unit 30 includes an integration determination unit 31, a unit voltage switching control unit 32, and a single unit voltage control unit 33. The integration conversion unit 40 includes an input unit 21, a unit voltage check integration unit 42, a threshold voltage unit 43, and a comparator 24. The unit voltage check integration unit 42 includes a first switch SW1, a second switch SW2, a third switch SW3, a capacitance Co, a resistance unit 420, and a positive current source 220.

The AD converter 200 converts an input voltage Vin into a digital value by comparing an integrated voltage Vo, which is generated by integrating a unit voltage with the input voltage Vin as an initial value in the integration unit 42, with a threshold voltage Vt by the comparator 24. As for a unit voltage that is a unit of the amount of change in the integrated voltage, there are two types of unit voltages in the AD converter a rough adjustment unit voltage VG2 that is a relatively large unit voltage, and a fine adjustment unit voltage VG1 that is a minimum unit voltage. There is provided a function of checking which of a difference between the threshold voltage and the input voltage and the rough adjustment unit voltage is larger, by using the unit voltage check integration unit 42, performing, when the rough adjustment unit voltage is larger than the difference, integration up to the threshold voltage only with the fine adjustment unit voltage, and performing, when the rough adjustment unit voltage is smaller than the difference, integration up to the threshold voltage by using the rough adjustment unit voltage and the fine adjustment unit voltage.

The AD converter 200 of this embodiment includes the integration conversion unit 40 that has two types of integration units which are units of the amount of change in an integrated voltage, a threshold voltage which determines an end point of integration, and the comparator 24 which compares the integrated voltage with the threshold voltage, and that integrates the integrated voltage until reaching the threshold voltage, and the control unit 30 that has the integration determination unit 31 which, before the integration is started, causes processing of comparing an initial value of the integrated voltage with the threshold voltage to be performed, the unit voltage switching control unit 32 which, when the initial value of the integrated voltage is smaller than the threshold voltage, causes execution as processing of the integration conversion unit 40, and the single unit voltage control unit 33 which, when the initial value of the integrated voltage is larger than the threshold voltage, causes execution as processing of the integration conversion unit 40.

The integration conversion unit 40 in this embodiment has the threshold voltage unit 43 that provides a threshold voltage that determines an end point of integration, the unit voltage check integration unit 42 that has a function of checking by a check voltage that the input voltage Vin is close to a threshold and generates an integrated voltage, the input unit 21 that provides an initial value to the unit voltage check integration unit 42, and the comparator 24 that outputs a result of comparing the integrated voltage with the threshold voltage.

The unit voltage check integration unit 42 has the positive current source 220 that has two types of current values corresponding to the rough adjustment unit voltage and the fine adjustment unit voltage and outputs a charge which causes an integrated voltage to be generated, a capacitance Co that accumulates the charge to generate the integrated voltage, the first switch SW1 that is connected in accumulating the charge from the positive current source 220 into the capacitance Co, the second switch SW2 that is connected in accumulating an initial value into the capacitance Co, and the resistance unit 420 and the third switch SW3 that cause a check voltage larger than the rough adjustment unit voltage to be generated.

In converting an input voltage Vin into a digital value, the input voltage Vin is output to the unit voltage check integration unit 42 as an initial value by the input unit 21 and the second switch SW2 is connected in the unit voltage check integration unit 42, thereby causing the capacitance Co to be initialized by the input voltage Vin. Next, the integration determination unit 31 of the control unit 30 determines which of the initial value of the integrated voltage and the threshold voltage is larger.

In determining which of the initial value of the integrated voltage and the threshold voltage is larger, the positive current source 220 is set to a current value corresponding to the rough adjustment unit voltage and the third switch SW3 is connected, thereby causing the resistance unit 420 to generate a check voltage larger than the rough adjustment unit voltage. At this time, the integrated voltage becomes the sum of the check voltage and the input voltage Vin. When the integrated voltage is smaller than the threshold voltage Vt, it is determined that the input voltage Vin is not close to a threshold, and the unit voltage switching control unit controls the integration conversion unit 40 to perform integration. When the integrated voltage is larger than the threshold voltage Vt, it is determined that the input voltage is close to the threshold, and the single unit voltage control unit 33 controls the integration conversion unit 40 to perform integration. The subsequent operation is the same as that of the AD converter 100.

As described above, the AD converter 200 of this embodiment includes the unit voltage check integration unit 42 that uses an input voltage Vin as an initial value and repeats the operation of integrating one or both of two types of unit voltages with the input voltage, thereby generating an integrated voltage and also generates a check voltage larger than a larger one of the unit voltages, the threshold voltage unit 43 that includes a threshold voltage causing the operation of integrating to be terminated, the comparator 24 that compares the integrated voltage with the threshold voltage, the integration determination unit 31 that, before the operation of integrating is started, causes the comparator 24 to compare a sum voltage with the threshold voltage, the sum voltage being a sum of the input voltage Vin and the check voltage, the unit voltage switching control unit 32 that, when the threshold voltage is larger than the check voltage, controls the unit voltage check integration unit 42 to generate the integrated voltage by using the two types of unit voltages, and the single unit voltage control unit 33 that, when the threshold voltage is smaller than the check voltage, controls the unit voltage check integration unit 42 to generate the integrated voltage by using only a smaller one of the unit voltages. According to this, an AD converter that, even if an input voltage is close to a threshold, does not cause a missing code and prevents the accuracy of signal analysis in later stages of the AD converter from deteriorating can be provided.

Modification 2

Figure 6:
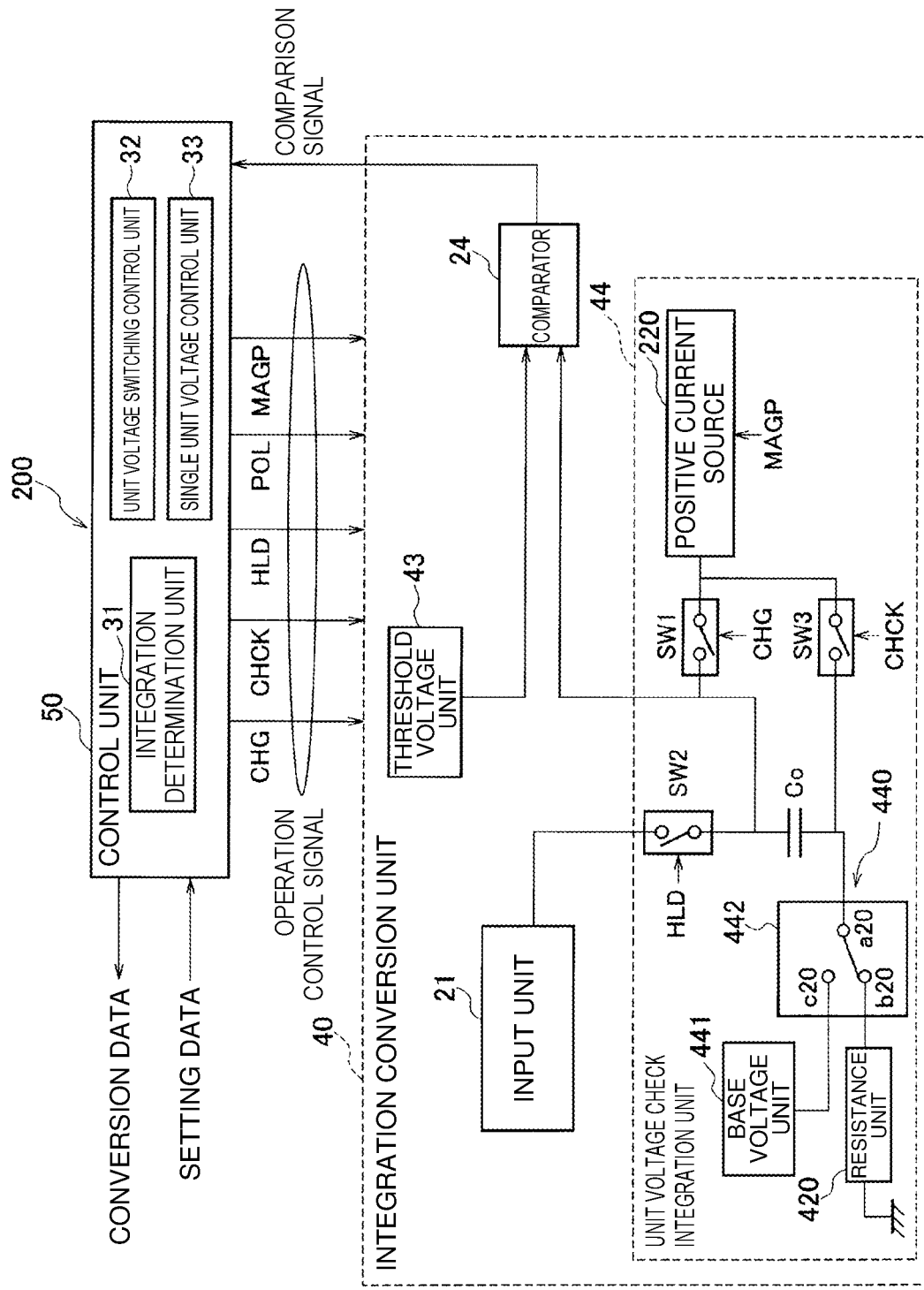
FIG. 6 is a functional block diagram illustrating a configuration example of a modification of the AD converter illustrated in FIG. 5.

FIG. 6 illustrates a modification of the unit voltage check integration unit 42. A unit voltage check integration unit 44 of Modification 2 illustrated in FIG. 6 is different from FIG. 5 in that a difference arithmetic unit 440 is provided between the capacitance Co and the ground. The difference arithmetic unit 440 includes a base voltage unit 441 and a switching switch 442.

In a configuration in FIG. 5, conversion is impossible when the input voltage Vin is equal to or higher than the fine adjustment threshold voltage. However, in a configuration in FIG. 5, when the input voltage Vin is equal to or higher the fine adjustment threshold voltage, the range of input voltage Vin can be extended by performing processing of holding a difference between the input voltage Vin and a base voltage which is generated by the base voltage unit 441, in the capacitance Co by using the difference arithmetic unit 440. The other operations are the same as the AD converter 200.

REFERENCE SIGNS LIST 10, 30 control unit
11, 31 integration determination unit
12, 32 unit voltage switching control unit
13, 33 single unit voltage control unit
20, 40 integration conversion unit
21 input unit
22, 25 integration unit
23 switching threshold unit
24 comparator
42, 44 unit voltage check integration unit
43 threshold voltage unit
100, 200 AD converter
251, 441 base voltage unit
252, 442 switching switch

The invention claimed is:

1. An AD converter, comprising:
an integration unit that uses an input voltage as an initial value and repeats an operation of integrating one or both of two types of unit voltages with the input voltage, thereby generating an integrated voltage;
a switching threshold voltage unit that includes two types of threshold voltages causing the operation of integrating to be terminated;
a comparator that compares the integrated voltage with the threshold voltages;
an integration determination unit that, before the operation of integrating is started, causes the comparator to compare the input voltage with a rough adjustment threshold voltage corresponding to a larger one of the unit voltages;
a unit voltage switching control unit that, when the rough adjustment threshold voltage is larger than the input voltage, controls the integration unit to generate the integrated voltage by using the two types of unit voltages; and
a single unit voltage control unit that, when the rough adjustment threshold voltage is smaller than the input voltage, controls the integration unit to generate the integrated voltage by using only a smaller one of the unit voltages.

2. The AD converter according to claim 1, wherein the integration unit includes:
a base voltage unit that generates a base voltage lower than the input voltage; and
a switching switch that switches, between a ground potential and the base voltage, a target to which a terminal of a capacitance on a side to be connected to the ground potential is connected, the capacitance holding the integrated voltage.

3. An AD converter, comprising:
a unit voltage check integration unit that uses an input voltage as an initial value and repeats an operation of integrating one or both of two types of unit voltages with the input voltage, thereby generating an integrated voltage and also generates a check voltage larger than a larger one of the unit voltages;
a threshold voltage unit that includes a threshold voltage causing the operation of integrating to be terminated;
a comparator that compares the integrated voltage with the threshold voltage;
an integration determination unit that, before the operation of integrating is started, causes the comparator to compare a sum voltage with the threshold voltage, the sum voltage being a sum of the input voltage and the check voltage;
a unit voltage switching control unit that, when the threshold voltage is larger than the check voltage, controls the unit voltage check integration unit to generate the integrated voltage by using the two types of unit voltages; and
a single unit voltage control unit that, when the threshold voltage is smaller than the check voltage, controls the unit voltage check integration unit to generate the integrated voltage by using only a smaller one of the unit voltages.

4. The AD converter according to claim 3, wherein the unit voltage check integration unit includes:
a base voltage unit that generates a base voltage lower than the input voltage; and
a switching switch that switches, between a ground potential and the base voltage, a target to which a terminal of a capacitance on a side to be connected to the ground potential is connected, the capacitance holding the integrated voltage.

* * * * *